(12) United States Patent
Ogino

(10) Patent No.: US 7,515,886 B2
(45) Date of Patent: Apr. 7, 2009

(54) DIGITAL BROADCAST RECEIVING TUNER AND RECEIVING DEVICE INCORPORATING IT

(75) Inventor: Hitoshi Ogino, Toyonaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 800 days.

(21) Appl. No.: 10/775,225

(22) Filed: Feb. 11, 2004

(65) Prior Publication Data

US 2004/0229583 A1    Nov. 18, 2004

(30) Foreign Application Priority Data

Feb. 19, 2003    (JP)    ............................. 2003-040679

(51) Int. Cl.
*H04B 17/02*    (2006.01)

(52) U.S. Cl. ...................... 455/136; 455/232.1; 455/69; 330/254

(58) Field of Classification Search .............. 455/136, 455/232.1, 69; 330/254
See application file for complete search history.

(56) References Cited

U.S. PATENT DOCUMENTS

| | | | | |
|---|---|---|---|---|
| 5,548,833 A | * | 8/1996 | Townsend | 455/234.1 |
| 6,359,944 B1 | * | 3/2002 | Curtis et al. | 375/344 |
| 6,586,996 B2 | * | 7/2003 | Fanous et al. | 330/254 |
| 6,590,872 B1 | * | 7/2003 | Shiue et al. | 370/314 |
| 6,657,678 B1 | * | 12/2003 | Mizukami et al. | 348/726 |
| 6,658,242 B1 | * | 12/2003 | Knutson et al. | 455/232.1 |
| 7,039,376 B2 | | 5/2006 | Isoda | |

FOREIGN PATENT DOCUMENTS

| | | |
|---|---|---|
| JP | 11-289268 | 10/1999 |
| JP | 11-308138 | 11/1999 |
| JP | 2001-024539 | 1/2001 |
| JP | 2001-136447 A | 5/2001 |
| JP | 2002-135149 | 5/2002 |

* cited by examiner

*Primary Examiner*—Nay A Maung
*Assistant Examiner*—Richard Chan
(74) *Attorney, Agent, or Firm*—Birch, Stewart, Kolasch & Birch, LLP

(57) ABSTRACT

In a digital broadcast receiving tuner, a down-converter unit converts a high-frequency signal into a baseband signal directly or by once converting it into an intermediate frequency signal. A gain adjuster unit properly adjusts the actual level of the high-frequency signal and/or the intermediate frequency signal in correspondence with an AGC (automatic gain control) controlling voltage supplied from an external source. An amplifier properly adjusts the actual level of the baseband signal. A controlling unit properly controls the actual gain of the amplifier in response to a specific signal independent of the AGC controlling voltage. This configuration makes it possible to constantly secure optimal performance characteristics in whatever condition the received signal may be.

6 Claims, 4 Drawing Sheets

DIGITAL BROADCAST RECEIVING TUNER AND RECEIVING DEVICE INCORPORATING IT

This nonprovisional application claims priority under 35 U.S.C. § 119(a), on Patent Application No. 2003-040679 filed in Japan on Feb. 19, 2003, the entire contents of which are hereby incorporated by reference.

BACKGROUND OF THE INVENTION

1. Field of the Invention

The present invention relates to a digital broadcast receiving tuner and to a digital broadcast receiving device incorporating such a tuner.

2. Description of the Prior Art

Normally, a digital broadcast receiving tuner has necessarily been incorporated in any of the conventional receiving devices for receiving a variety of digital broadcast signals transmitted from any of the communication broadcast satellite stations, any of the digital signal broadcast satellite stations, and any of the conventional digital ground wave broadcast stations.

FIG. 5 exemplifies a typical constitution of a conventional tuner for receiving a digital broadcast signal. The tuner shown in FIG. 5 consists of a conventional digital satellite broadcast receiving tuner capable of down-converting the received digital signal based on the direct conversion format. The conventional digital broadcast receiving tuner shown in FIG. 5 incorporates the following: an RF (radio frequency) input terminal 1, an RF amplifier 2, an RF attenuator 3, a variable gain amplifier 4, mixers 5 and 6, amplifiers 7 and 8, a 90° phase shifter 9, a voltage-controlled oscillator 10, a PLL (phase-locked loop) circuit 11, and output terminals 12 and 13. Of these, normally, the variable gain amplifier 4, the mixers 5 and 6, the amplifiers 7 and 8, and the 90° phase shifter 9, are jointly loaded in a chip consisting of a direct conversion IC (integrated circuit).

Initially, an RF signal transmitted from a satellite broadcast station is received by an antenna (not shown) on the ground. Next, an RF signal in the 12 GHz frequency band received by the antenna is initially amplified up to a proper level and then down-converted into an RF signal in the 1 GHz frequency band by a low noise block down converter (LNB) (not shown), and finally, the converted RF signal is transmitted to the RF input terminal 1 installed in the digital broadcast receiving tuner shown in FIG. 5. Then, the RF signal input to the RF input terminal 1 is amplified by the RF amplifier 2. Actual level of the amplified RF signal is then properly adjusted by the RF attenuator 3 and the variable gain amplifier 4. The level-adjusted RF signal is then divided into two part and then transmitted to the mixers 5 and 6. Note that the gains of the RF attenuator 3 and the variable gain amplifier 4 are variable by an AGC (automatic gain control) controlling voltage supplied from an external source comprising a demodulating IC.

Either of the RF signals split into two parts is then mixed with a locally oscillating signal generated from the voltage-controlled oscillator 10 by means of the mixer 5, and is thereby converted into an I baseband signal, which is then transmitted to the output terminal 12 via the amplifier 7. The 90° phase shifter 9 shifts the phase of the locally oscillating signal generated from the voltage-controlled oscillator 10 by 90 degrees. The other RF signal split into two parts is initially mixed with a locally oscillating signal output from the 90° phase shifter by means of the mixer 6, and is thereby converted into a Q baseband signal before being transmitted to the output terminal 13 via the amplifier 8. Based on the serial operations performed as described above, the I baseband signal output from the output terminal 12 and the Q baseband signal output from the output terminal 13 are individually provided with own phase being different from each other by 90 degrees. Note that the PLL circuit 11 properly controls the voltage-controlled oscillator 10 in order that the locally oscillating signal output from the voltage-controlled oscillator 10 can correctly become a specific frequency substantially identical to that of the RF signals split into two parts.

Next, another typical example of a conventional digital broadcast receiving tuner is exemplified in FIG. 6. The conventional digital broadcast receiving tuner shown in FIG. 6 consists of a digital ground wave receiving tuner capable of down-converting the received signal by double conversion, comprising the following: an RF input terminal 21, an RF amplifier 22, an RF attenuator 23, a mixer 24, a voltage-controlled oscillator 25, a PLL circuit 26, a variable gain amplifier 27, another mixer 28, a local oscillator 29, and an output terminal 30. The mixer 24 as the first down-converting IC and the other mixer 28 as the second down-converting IC, are discretely loaded in an individual semiconductor chip. Normally, the variable gain amplifier 27 is included in either of the first and second down-converting ICs. In place of the local oscillator 29 oscillating a stationary frequency, it is also allowable to provide another voltage-controlled oscillator for oscillating an optional frequency and another PLL circuit for controlling operation of the newly provided voltage-controlled oscillator.

The RF signal received by a ground antenna (not shown) is transmitted to the RF input terminal 21 installed in the conventional digital broadcast receiving tuner shown in FIG. 6.

The RF signal transmitted to the RF input terminal 21 is then amplified by the RF amplifier 22, and then, actual level of the amplified RF signal is properly adjusted by the RF attenuator 23 before being transmitted to the mixer 24.

The RF signal output from the RF attenuator 23 is mixed with a locally oscillating signal output from the voltage-controlled oscillator 25 by means of the mixer 24, and is thereby converted into an intermediate frequency signal, and then, the actual level of this intermediate frequency signal is properly adjusted by the variable gain amplifier 27 before being transmitted to the other mixer 28. Note that the gains of the RF attenuator 23 and the variable gain amplifier 27 are individually subject to variation in correspondence with an AGC controlling voltage supplied from an external source comprising a demodulating IC. Further, the PLL circuit 26 properly controls operation of the voltage-controlled oscillator 25 in order that the locally oscillating signal output from the voltage-controlled oscillator 25 can correctly become a specific frequency so that the difference between the locally oscillating signal and the RF signal frequency can exactly coincide with the actual frequency of the intermediate frequency signal.

Next, the intermediate frequency signal output from the variable gain amplifier 27 is mixed with a locally oscillating signal output from the local oscillator 29 by means of the mixer 28 so as to be converted into a baseband signal, which is then transmitted to the output terminal 30.

Nevertheless, whenever operating either of the above-referred conventional digital broadcast receiving tuners exemplified in FIGS. 5 and 6, there has been many instances in which optimal performance characteristics could hardly be secured depending on the actual condition on the way of receiving RF signals. For example, as shown in FIG. 7A, insofar as the actual level of an RF signal within a receivable frequency band width remains flat, the carrier-to-noise (C/N)

characteristics should closely be scrutinized. Conversely, when the actual level of an RF signal within a receivable frequency band width is not flat, distortion characteristics should closely be scrutinized. Inconveniently, however, either of the above-referred digital broadcast receiving tuners shown in FIGS. 5 and 6 respectively perform identical operations even when the actual level of the received signal within a receivable frequency band width remains flat or irregular, and thus it has thus far been quite difficult to constantly secure optimal performance characteristics at least in either of the cases in which the actual level of the received signal within a receivable frequency band width remains flat or being irregular.

SUMMARY OF THE INVENTION

Accordingly, an object of the present invention is to provide a digital broadcast receiving tuner that offers optimal performance in whatever condition the received signal may be and a digital broadcast receiving device incorporating such a tuner.

To achieve the above object, the tuner for receiving a digital broadcast signal according to an embodiment of the present invention comprises the following: a down-converter unit which directly or provisionally converts a high-frequency signal into an intermediate frequency signal and then further converts the intermediate frequency signal into a baseband signal; a gain adjuster which properly adjusts the actual level of the high-frequency signal and/or the intermediate frequency signal in correspondence with an AGC controlling voltage supplied from an external source; an amplifier which properly adjusts the actual level of the baseband signal, and a controlling unit which properly controls the gain of the amplifier in correspondence with a specific signal being independent of the AGC controlling voltage.

In the inventive tuner for receiving a digital broadcast signal comprising the constitution described above, by using a specific signal independent of the AGC controlling voltage as an external controlling signal reflecting the condition of the received signal, it is possible to stably secure optimal performance characteristics in whatever condition the received signal may be.

Further, in order to achieve the above object, the receiving device according to the present invention comprises the following a digital broadcast receiving tuner comprising the above constitution; a demodulator which demodulates a baseband signal output from the digital broadcast receiving tuner; an AGC controlling voltage generator which generates an AGC controlling voltage based on the baseband signal; a signal generator which, based on the baseband signal, generates a specific signal being independent of the AGC controlling voltage, wherein the independent signal is used by a controlling unit installed in the digital broadcast receiving tuner; and a correction unit which corrects the AGC controlling voltage in correspondence with the condition of the received signal.

Owing to the provision of the above constitution, since the correction unit properly compensates for the AGC controlling voltage in response to the condition of the received signal, independently of actual location of the digital broadcast receiving device being operated, it is always possible to optimally carry on the automatic gain controlling operation. Further, since a specific signal being independent of the AGC controlling voltage is used as reflecting the condition of the received signal, it is possible for the inventive digital broadcast receiving tuner to stably secure optimal performance characteristics including the automatic gain controlling characteristics in whatever condition the received signal may be. Accordingly, provision of the above constitution enables the digital broadcast receiving tuner related to the present invention to continuously secure an optimal reception condition.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
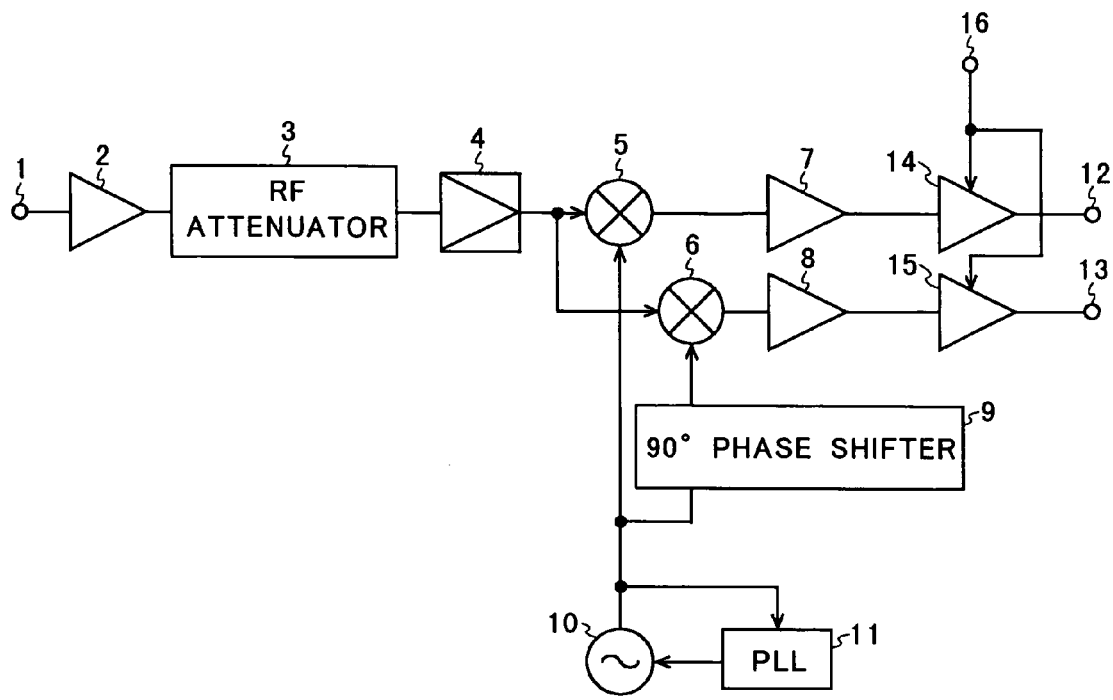
FIG. 1 is a simplified schematic block diagram for designating the constitution of a digital broadcast receiving tuner according to the first embodiment of the present invention.
Figure 5:
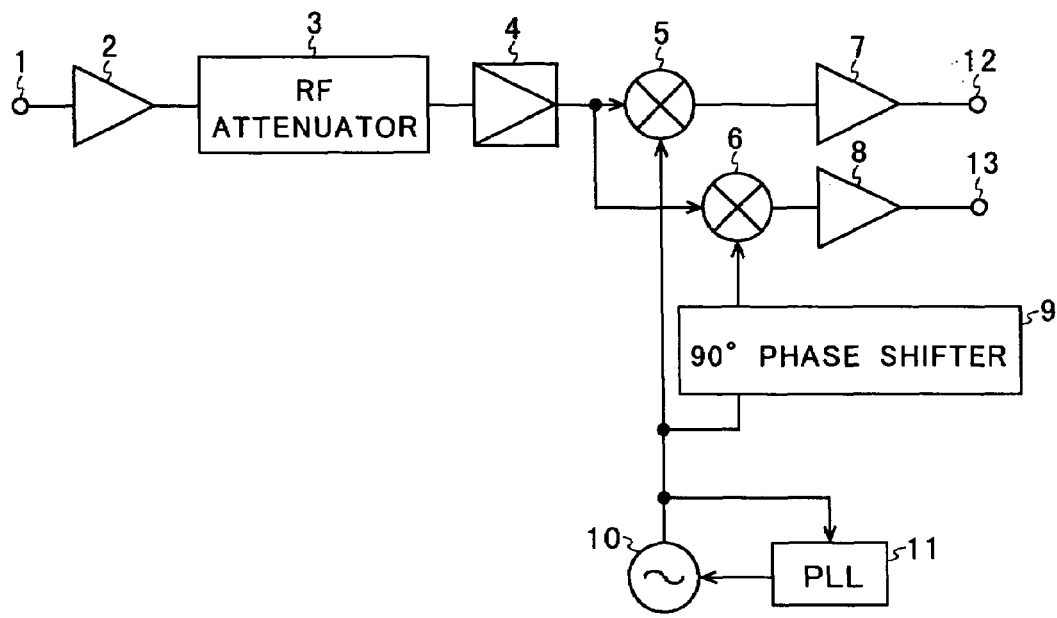
FIG. 5 is a simplified block diagram for exemplifying a typical constitution of a conventional digital broadcast receiving tuner.

FIG. 1 designates a simplified, constitution of a digital broadcast receiving tuner according to the first form for implementing the present invention. Those corresponding circuit components shown in FIG. 1 and FIG. 5 are individually designated by corresponding reference numerals identical to each other, thereby deleting detailed description thereof The digital broadcast receiving tuner shown in FIG. 1 consists of a digital broadcast receiving tuner capable of down-converting the received signal based on the direct conversion format. The tuner shown in FIG. 1 is complete with the provision of amplifiers 14 and 15 and an externally provided input terminal 16 in addition to those circuit components loaded in the conventional digital broadcast receiving tuner shown in FIG. 5. It is desired that the amplifiers 14 and 15 and the externally provided input terminal 16 be jointly loaded in a single IC chip so as to have it function as a direct conversion IC in conjunction with a variable gain amplifier 4, mixers 5 and 6, amplifiers 7 and 8, and a 90° phase shifter 9, respectively.

In the above constitution shown in FIG. 1, the amplifier 14 is disposed between the amplifier 7 and the output terminal 12, whereas the other amplifier 15 is disposed between the amplifier 8 and the output terminal 13. Gains of the amplifiers 14 and 15 are individually variable in correspondence with an external controlling signal supplied to the external input terminal 16. The external controlling signal supplied to the external input terminal 16 is totally independent of the AGC controlling voltage and reflects the condition of the received signal. For example, it is so arranged that, while the actual level of the received signal within a receivable frequency band-width remains flat, the external controlling signal is enabled to function itself so as to lower the gains of the amplifiers 14 and 15, whereas if the actual level of the received signal within a receivable frequency band width remains irregular, the external controlling signal is enabled to function itself so as to enhance the gains of the amplifiers 14 and 15. It is desired that the gains of the amplifiers 14 and 15 will respectively be subject to variation continuously in response to the external controlling signal.

Figure 7A:
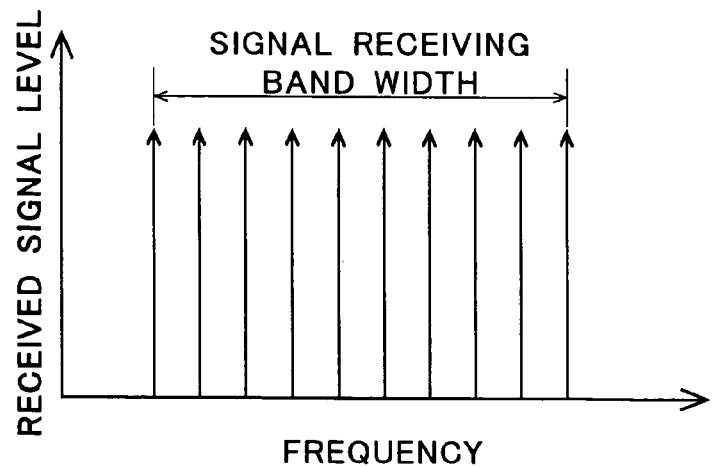
FIG. 7A is a chart for designating frequency characteristics relative to the received signal level.
Figure 7B:
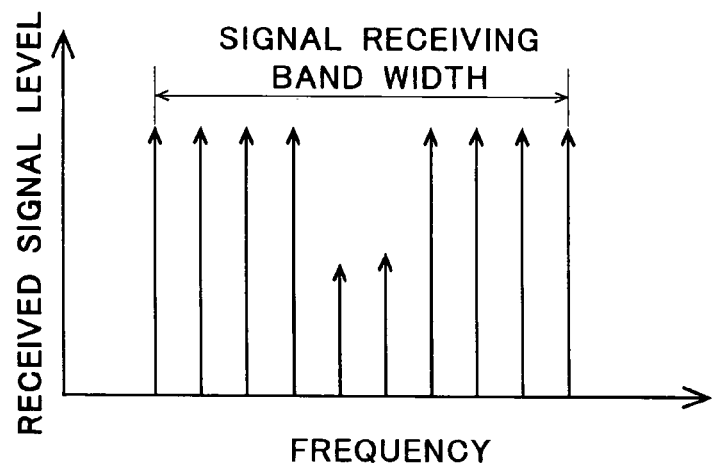
FIG. 7B is another chart for designating frequency characteristics relative to the received signal level.
Figure 7C:
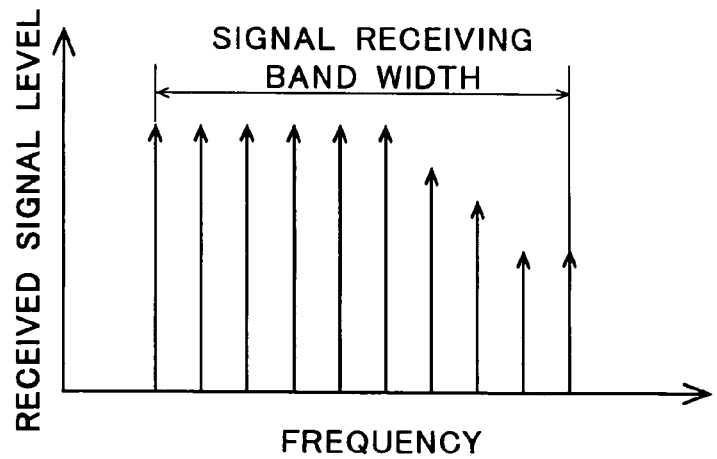
FIG. 7C is another chart for designating frequency characteristics relative to the received signal level.

Owing to the provision of the above constitution, whenever the actual level of the received signal within a receivable frequency band width remains flat as shown in FIG. 7A, it is possible to closely scrutinize the carrier-to-noise (C/N) characteristics, whereas when the actual level of the received signal within a receivable frequency band width remains irregular as shown in FIGS. 7B and 7C, it is possible to closely scrutinize the distortion characteristics. In other words, by controlling the gains of amplifiers, distribution of the gain in the tuner itself or the gain in an operated IC itself is variable, thereby making it possible to optimally adjust burden applied to those circuit components other than the amplifiers. This makes it possible to obtain optimal performance in whatever condition the received signal may be. It should be noted that, if it is so arranged that the gain of the amplifiers 14 and 15 is continuously variable in response to the external controlling signal, then, it is also possible to constantly secure optimal performance characteristics with higher precision in whatever condition the received signal may be.

Figure 2:
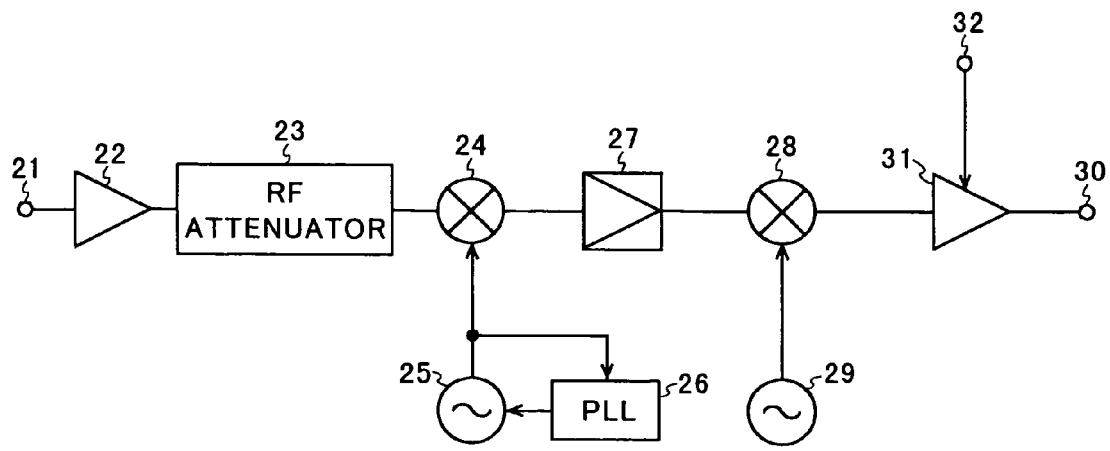
FIG. 2 is a simplified schematic block diagram for designating the constitution of a digital broadcast receiving tuner according to the second embodiment of the present invention.
Figure 6:
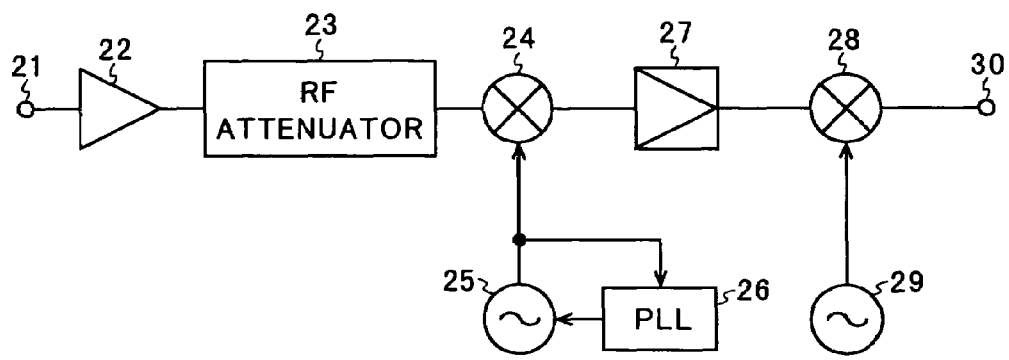
FIG. 6 is a simplified block diagram for exemplifying another typical constitution of a conventional digital broadcast receiving tuner.

FIG. 2 designates a typical constitution of a digital broadcast receiving tuner according to the second embodiment of the present invention. The tuner shown in FIG. 2 consists of a digital terrestrial broadcast receiving tuner that down-converts the received signal by double conversion. The tuner shown in FIG. 2 is additionally provided with an amplifier 31 and an externally provided input terminal 32 in addition to the proper components of a conventional digital broadcast receiving tuner shown in FIG. 6. It is desired that the amplifier 31 and the external input terminal 32 be jointly loaded in a single IC chip functioning itself as the second down-converting IC in conjunction with a mixer 28.

As shown in FIG. 2, the amplifier 31 is disposed between the mixer 28 and an output terminal 30. Gain of the amplifier. 31 is variable in response to an external controlling signal transmitted to the external input terminal 32. The external controlling signal transmitted to the external input terminal 32 is totally independent of an AGC controlling voltage and reflects the condition of the received signal. For example, it is so arranged that, when the actual level of the received signal within a receivable frequency band width remains flat, the external controlling signal is enabled to function itself so as to lower the gain of the amplifier 31. Conversely, it is so arranged that, when the actual level of the received signal within a receivable frequency band width remains irregular, the external controlling signal is enabled to function itself to enhance the gain of the amplifier 31. It is desired that the gain of the amplifier 31 be continuously variable in correspondence with the external controlling signal.

Owing to the provision of the above constitution, as shown in FIG. 7A, when the actual level of the received signal within a receivable frequency band width remains flat, it is possible to closely scrutinize the carrier-to-noise (C/N) characteristics. Conversely, as shown in FIGS. 7B and 7C, when the actual level of the received signal within a receivable frequency band width remains irregular, it is possible to closely scrutinize the distortion characteristics. In other words, by controlling the gains of the amplifiers, distribution of the gain in the tuner itself or the gain of an operated IC itself is variable, thereby making it possible to optimally adjust burden applied to those circuit components other than amplifiers, thus enabling the inventive tuner to stably secure optimal performance characteristics in whatever condition the received signal may be. It should be noted that, if it is so arranged that the gain of the amplifier 31 is continuously variable, then, it is possible to constantly secure optimal performance characteristic with higher precision in whatever condition the received signal may be.

Instead of disposing the amplifier 31 between the mixer 28 and the output terminal 30, it is also allowable to dispose the amplifier 31 between the mixer 24 and the variable gain amplifier 27 or between the variable gain amplifier 27 and the mixer 28. It is desired that the amplifier 31 and the external input terminal 32 be jointly loaded in the first down-converting IC at least storing the mixer 24 or in the second down-converting IC at least storing the mixer 28. It is further desired that the gain of the amplifier 31 be continuously variable in response to the external controlling signal.

Even when providing the above constitution, as in the case of disposing the amplifier 31 between the mixer 28 and the output terminal 30, insofar as the actual level of the received signal within a receivable frequency band width remains flat as shown in FIG. 7A, it is possible to closely scrutinize the carrier-to-noise (C/N) characteristics. Conversely, if the actual level of the received signal within a receivable frequency band width remains irregular as shown in FIGS. 7B and 7C, it is possible to closely scrutinize the distortion characteristics. In other words, by controlling the gains of amplifiers, distribution of the gain in the tuner itself or in an operated IC itself is variable, thereby making it possible to optimally adjust such burden applied to those circuit components other than amplifiers. Accordingly, it is possible to constantly secure optimal performance characteristics in whatever condition the received signal may be. If it is so arranged that the gain of the amplifier 31 is continuously variable in correspondence with the external controlling signal, it is possible to stably secure optimal performance characteristics with higher precision in whatever condition the received signal may be.

Figure 3:
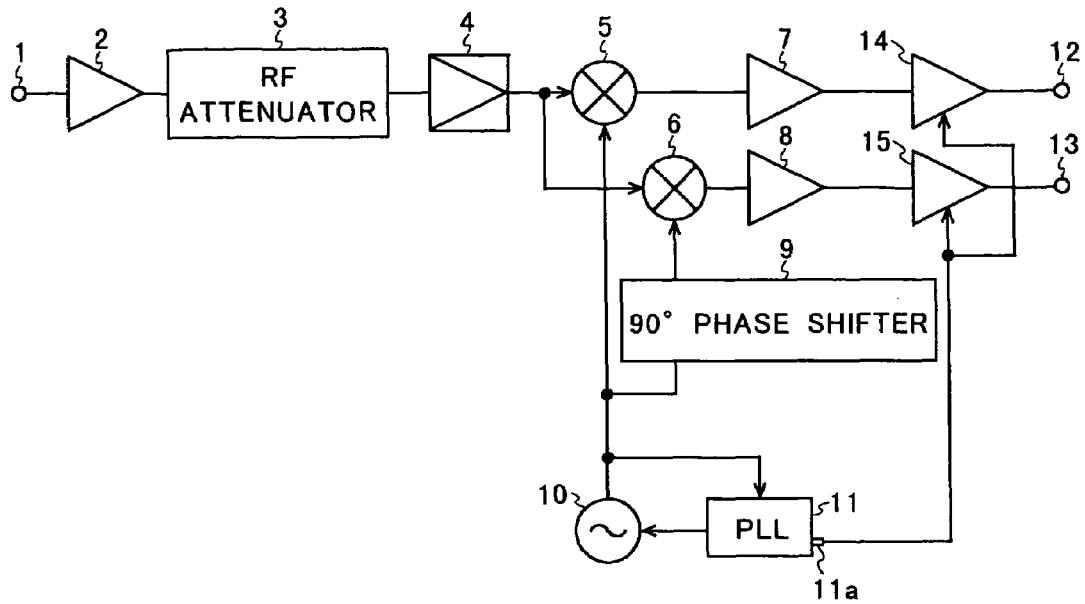
FIG. 3 is a simplified schematic block diagram for designating the constitution of a digital broadcast receiving tuner according to the third embodiment of the present invention.

FIG. 3 designates a typical constitution of a digital broadcast receiving tuner according to the third embodiment of the present invention. Those corresponding circuit components shown in FIGS. 1 and 3 are individually designated by corresponding reference numerals identical to each other, thereby deleting further description thereof The digital broadcast receiving tuner according to the third embodiment shown in FIG. 3 makes a difference from the first embodiment shown in FIG. 1 in that the third embodiment deletes provision of the external input terminal 16, and further, the gains of the amplifiers 14 and 15 are individually variable in correspondence with a controlling signal output from a versatile port 11a of the PLL circuit 11. The PLL circuit 11 receives a data signal pertaining to the condition of the received signal via an I2C bus (not shown) and then outputs a controlling signal reflecting the condition of the received signal via a versatile port 11a. Note that the controlling signal output from the versatile port 11a is totally independent of the AGC controlling voltage. Owing to this arrangement, it is possible for the PLL circuit 11 to properly control operations of the amplifiers 14 and 15 as if being programmed by software, thereby making it possible to delete a signal generating circuit comprising hardware otherwise required for solely controlling operations of the amplifiers 14 and 15. It should be noted that, in place of the above constitution, it is also allowable to vary the gains of the amplifiers 14 and 15 in response to a controlling signal output from a versatile port of a specific semiconductor integrated circuit loaded in a down-converter other than the PLL circuit 11.

Figure 4:
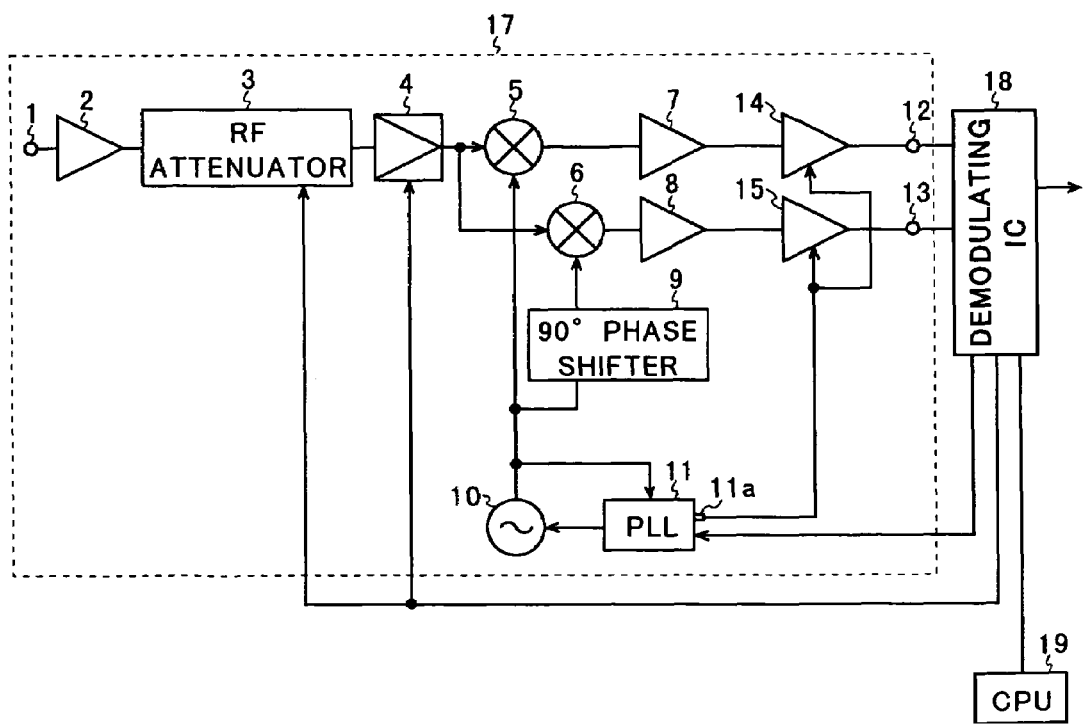
FIG. 4 is a simplified circuit diagram for exemplifying a typical constitution of a receiving device according to the present invention.

FIG. 4 designates a typical constitution of a receiving device according to an embodiment of the present invention. Those corresponding circuit components shown in FIGS. 3 and 4 are individually designated by corresponding reference numerals identical to each other, thereby deleting detailed description thereof.

The receiving device according to the present invention shown in FIG. 4 essentially comprises a digital broadcast receiving tuner 17 comprising the constitution exactly identical to that of the digital broadcast receiving tuner shown in FIG. 3, a demodulating IC 18, and a CPU (central processing unit) 19, respectively.

The digital broadcast receiving tuner 17 outputs an I baseband signal and a Q baseband signal to the demodulating IC 18. In response, the demodulating IC 18 demodulates the I baseband signal and the Q baseband signal (based on an 8-phase shift keying (PSK) method for example), and then outputs a transport stream data. In addition, based on the I baseband signal and the Q baseband signal, the demodulator IC 18 prepares specific data pertaining to the condition of the received signal, and then outputs the prepared data to the PLL circuit 11 via an I2C bus.

Further, the demodulating IC 18 previously stores a reference AGC value corresponding to the actual levels of received signals in itself Note that, depending on the location at which the inventive receiving device is disposed, there may be a case in which the reference AGC value previously stored in the demodulating IC 18 may not be able to attain an optimal value. To prevent this failure, it is so arranged that the CPU 19 initially receives the data related to the condition of the received signal with the data of the reference AGC value output from the demodulating IC 18, and then, properly compensates for the reference AGC value in correspondence with the condition of the received signal before eventually returning the corrected reference AGC value to the demodulating IC 18. Next, by referring to the reference AGC value corrected by the CPU 19, the demodulating IC 18 generates an AGC controlling voltage compatible with the actual levels of the I baseband signal and the Q baseband signal transmitted from the digital broadcast receiving tuner 17, and finally, outputs the AGC controlling signal to the RF attenuator 3 and the variable gain amplifier 4. Accordingly, it is always possible to stably maintain an optimal reception condition. Note that the CPU 19 may be loaded in an operating unit identical to the one that accommodates other components including the digital broadcast receiving tuner 17 and the demodulating IC 18. Instead, it is also allowable to externally secure the CPU 19 to the unit in contrast with the remaining components being jointly loaded inside of the operating unit.

What is claimed is:

1. A digital broadcast receiving tuner comprising;
   a down-converting unit which directly converts a high-frequency signal into a baseband signal, or converts a high-frequency signal into an intermediate frequency signal and then further converts said intermediate frequency signal into a baseband signal;
   a gain-adjusting unit which adjusts a level of said high-frequency signal and/or said intermediate frequency signal in correspondence with an automatic gain control (AGC) controlling voltage supplied from an external source;
   an amplifier which adjusts a level of said baseband signal; and
   a controlling unit which controls a gain of said amplifier in response to a signal being independent of said AGC controlling voltage wherein said signal independent of said AGC controlling voltage is one that reflects frequency characteristics of a level of received signals within a receivable frequency band width and is a signal output from a versatile port of a semiconductor integrated circuit device loaded in said down-converting unit.

2. A digital broadcast receiving tuner according to claim 1, wherein said controlling unit controls said gain of said amplifier so as to be variable continuously.

3. A digital broadcast receiving device comprising;
   a digital broadcast receiving tuner;
   a demodulator which demodulates a baseband signal output from said digital broadcast receiving tuner;
   an automatic gain control (AGC) controlling voltage generator which generates an AGC controlling voltage based on said baseband signal;
   a signal generator;
   a correction unit which corrects said AGC controlling voltage in correspondence with condition of a received signal; wherein
   said digital broadcast receiving tuner further comprises;
   a down-converting unit which directly converts a high-frequency signal into said baseband signal, or converts a high-frequency signal into an intermediate frequency signal and then further converts said intermediate frequency signal into said baseband signal;
   a gain-adjusting unit which adjusts a level of said high-frequency signal and/or said intermediate frequency signal in correspondence with said AG controlling voltage supplied from an external source;
   an amplifier which adjusts a level of said baseband signal;
   a controlling unit which controls a gain of said amplifier in response to a signal being independent of said AGC controlling voltage wherein said signal independent of said AGC controlling voltage is one that reflects frequency characteristics of a level of said received signal within a receivable frequency band width and is a signal output from a versatile port of a semiconductor integrated circuit device loaded in said down-converting unit; and
   wherein said signal generator generates said signal independent of said AGC controlling voltage based on said baseband signal.

4. A digital broadcast receiving device according to claim 3, wherein said controlling unit controls said gain of said amplifier so as to be variable continuously.

5. A digital broadcast receiving tuner according to claim 1, wherein said amplifier is downstream to both said down-converting unit and said gain-adjusting unit.

6. A digital broadcast receiving device according to claim 3, wherein said amplifier is downstream to both said down-converting unit and said gain-adjusting unit.

* * * * *